(12) United States Patent
Mulkens et al.

(10) Patent No.: US 7,245,355 B2
(45) Date of Patent: *Jul. 17, 2007

(54) LITHOGRAPHIC APPARATUS, DEVICE MANUFACTURING METHOD

(75) Inventors: Johannes Catharinus Hubertus Mulkens, Waalre (NL); Wilhelmus Petrus De Boeij, Veldhoven (NL); Carsten Andreas Kohler, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/246,549

(22) Filed: Oct. 11, 2005

(65) Prior Publication Data

US 2006/0077373 A1    Apr. 13, 2006

Related U.S. Application Data

(63) Continuation-in-part of application No. 10/961,408, filed on Oct. 12, 2004.

(51) Int. Cl.
*G03B 27/54* (2006.01)
*G03B 27/42* (2006.01)
(52) U.S. Cl. .......................................... 355/67; 355/53
(58) Field of Classification Search ................ 355/52, 355/53, 55, 67–71, 77; 430/5, 20, 22; 356/399–401; 250/548
See application file for complete search history.

(56) References Cited

U.S. PATENT DOCUMENTS

| | | | |
|---|---|---|---|
| 6,410,192 B1 * | 6/2002 | Priestley et al. | 430/5 |
| 6,483,573 B1 | 11/2002 | Schuster | 355/71 |
| 2002/0027719 A1 | 3/2002 | Kreuzer | 359/631 |
| 2004/0257553 A1 * | 12/2004 | Totzeck | 355/67 |

OTHER PUBLICATIONS

Fujii et al., On Board Polarization Measuring Instrument for High NA Excimer Scanner, Metrology, Inspection, and Process Control for Microlithography XIX, Proc. of SPIE vol. 5752, (2005), pp. 846-852.
Nishinaga et al., Development of Polarized-Light Illuminator and Its Impact, Optical Microlithography XVIII, SPIE vol. 5754 (2005), pp. 669-680.
European Search Report issued for European Patent Application No. 05256041.4-2222, dated Jun. 14, 2006.
Kohler, et al., "Imaging Enhancements by Polarized Illumination: Theory and Experimental Verification," Proceedings of SPIE, vol. 5754, 2005, pp. 734-750.
Van de Kerkhof, et al., "Full Optical Column Characterization of DUV Lithographic Projection Tools," Proceedings of SPIE, vol. 5377, 2004, pp. 1960-1970.

* cited by examiner

*Primary Examiner*—Henry Hung Nguyen
(74) *Attorney, Agent, or Firm*—Pillsbury Winthrop Shaw Pittman LLP (57) ABSTRACT

To compensate for birefringence of a mask in a lithographic projection apparatus, the birefringence of a mask is measured and stored as birefringence data in a data storage device. A birefringent compensation element is disposed in the optical path of the lithographic projection apparatus. Appropriate adjustments of the compensation element are determined as those optimally reducing impact of the mask birefringence on the state of polarization at substrate level.

24 Claims, 8 Drawing Sheets

LITHOGRAPHIC APPARATUS, DEVICE MANUFACTURING METHOD

This application is a continuation-in-part of U.S. patent application Ser. No. 10/961,408, filed Oct. 12, 2004. The contents of which are incorporated herein by reference.

BACKGROUND OF THE INVENTION

1. Field of the Invention

The present invention relates to a lithographic apparatus, and a device manufacturing method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The imaging of the pattern involves illuminating the patterning device with electro magnetic radiation. With high Numerical Aperture (NA) projection systems and with high NA immersion projection systems for transfer of the pattern, it is desirable to provide polarized or at least partially polarized illumination radiation. This enables image formation at wafer level by radiation with a state of polarization which is suitable for optimal contrast of the image. For example, where image forming radiation has a p-polarized, an s-polarized and an unpolarized component, it is in particular the s-polarized radiation component which contributes most to contrast of the image. Consequently an illumination system for use with a lithographic apparatus may therefore be arranged to specifically provide s-polarized illumination radiation. However, optical elements downstream of the illumination system may destroy or affect the state polarization of radiation traversing these elements due to, for example, the presence of residual or inherent optical birefringence in the material of the elements or due to effects of optical (single or multi-layer) coatings on the element surfaces. During assembly of an optical system of a lithographic apparatus parameters affecting a state of polarization can be monitored and tolerance-controlled. However, optical elements not being a fixed part of the optical system, such as for example a patterning device embodied as a reticle, may cause a depolarization or a change of polarization affecting image contrast beyond tolerance.

SUMMARY OF THE INVENTION

It is desirable to have an improved control over the state of polarization of radiation in a lithographic apparatus at substrate level.

According to an aspect of the invention, there is provided a lithographic apparatus arranged to project a pattern from a patterning device onto a substrate using an electromagnetic radiation beam, comprising:

a data storage device arranged to receive and store data characterizing a birefringence property of the patterning device, a manipulator comprising one or more birefringent elements disposed in a path traversed by the radiation beam and arranged for adjusting said one or more birefringent elements to change a polarization state of the radiation beam, a controller responsive to said data and arranged to control said adjusting to compensate impact of the patterning device on a polarization state of said radiation beam at substrate level.

According to an aspect of the invention there is provided a lithographic apparatus arranged to project a pattern from a patterning device onto a substrate using an electromagnetic radiation beam, comprising:

a data storage device arranged to receive and store data characterizing a birefringence property of the patterning device, a manipulator comprising one or more birefringent elements disposed in a path traversed by the radiation beam and arranged for adjusting said one or more birefringent elements to change a polarization state of the radiation beam, a controller responsive to said data and arranged to control said adjusting to compensate impact of the patterning device on a polarization state of said radiation beam at substrate level, whereby the adjusting to compensate impact of the patterning device on a polarization state of said radiation beam at substrate level is combined with an adjusting to compensate additional impact on the polarization state of the radiation beam at substrate level of deviations from a target radiation-system polarization-characteristic and/or of deviations from a target projection-system polarization-characteristic.

According to another aspect of the invention, there is provided a device manufacturing method comprising projecting a pattern from a patterning device onto a substrate using an electromagnetic radiation beam, the method comprising:

storing data characterizing a birefringence property of the patterning device, adjusting one or more birefringent elements in use traversed by said radiation beam, controlling said adjusting to compensate impact of the patterning device on a polarization state of said radiation beam at substrate level.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
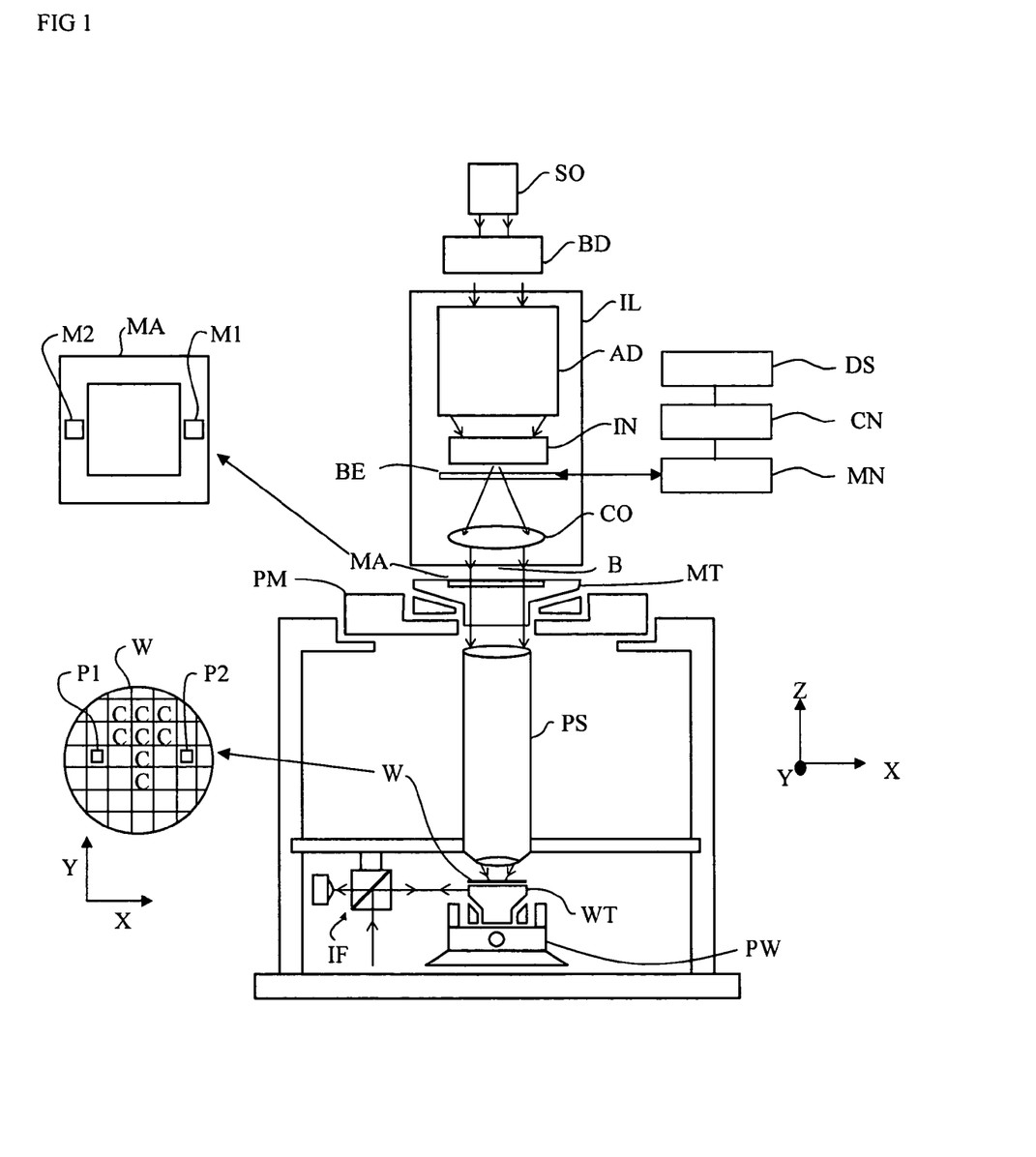
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g., UV radiation such as for example generated by an excimer laser operating at a wavelength of 193 nm or 157 nm radiation);
- a support structure (e.g., a mask table) MT constructed to support a patterning device (e.g., a mask) MA and connected to a first positioner PM configured to accurately position the patterning device in accordance with certain parameters;
- a substrate table (e.g., a wafer table) WT constructed to hold a substrate (e.g., a resist-coated wafer) W and connected to a second positioner PW configured to accurately position the substrate in accordance with certain parameters;
- a projection system (e.g., a refractive projection lens system) PS configured to project a pattern imparted to the radiation beam B by patterning device MA onto a target portion C (e.g., comprising one or more dies) of the substrate W;
- a data storage device DS arranged to receive and store data characterizing a birefringence property of the patterning device;
- a controller CN responsive to data stored in the data storage device DS; and
- a manipulator MN for disposing a birefringent element BE in the radiation beam B and for adjusting the birefringent element BE.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, and catadioptric optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. For reference in the text below, a scanning direction is the Y-direction as defined by the coordinate axes shown in FIG. 1. In the present context, an X,Y,Z-coordinate system is fixed with respect to the apparatus. Similarly, x- and y-axes are associated with a reticle and a mask pattern, whereby for a reticle for use with a scanner the direction of the y-axis corresponds with the Y-direction in which that reticle is scanned.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
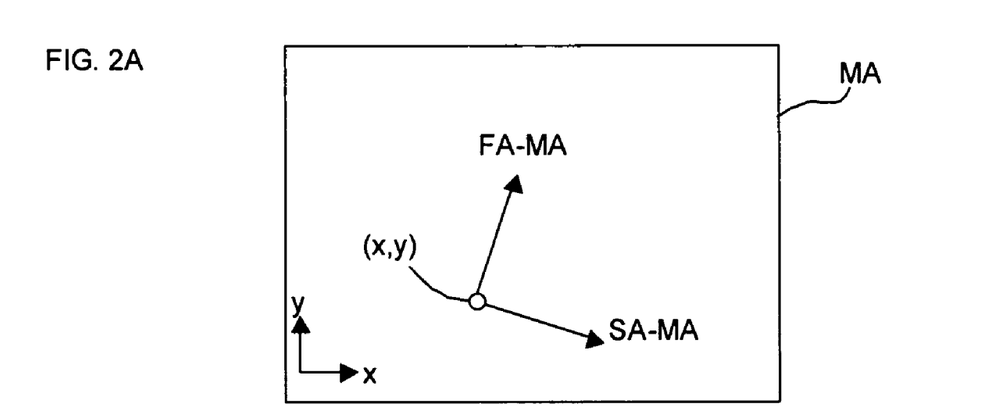
FIG. 2A depicts a mask with local fast and slow axes characteristic for birefringence.

Reticles for use with projection lithography typically consist of a quartz substrate, at one surface provided with the pattern to be imaged. Crystalline quarts is known to be birefringent, therefore reticle blanks are usually made of fused quartz. However, even if fused quartz is used for the reticle blank, the presence of some residual birefringence is practically unavoidable. As shown schematically in FIG. 2A, the birefringence of a portion of a reticle, referred to hereinafter as "reticle birefringence" and denoted by RB, can be modelled in a point (x,y) on the reticle MA as the birefringence of a retarder plate with a fast axis FA-MA and a slow axis SA-MA and with a phase retardation which is usually indicated as a fraction of the wavelength. In general, the reticle birefringence RB is a function of the reticle coordinates x and y. Both the orientation of the fast and slow axes (FA-MA, SA-MA) and the phase retardation may have an x,y distribution of values. This x,y dependence is expressed as:

$$RB=RB[A,N],$$

$$A=A(x,y), \text{ and}$$

$$N=N(x,y). \qquad \text{Equ. (1)}$$

Here, A is the angle between the y-axis and the fast axis, and N is the phase retardation expressed in fractions of the wavelength of the radiation beam B.

Figure 2B:
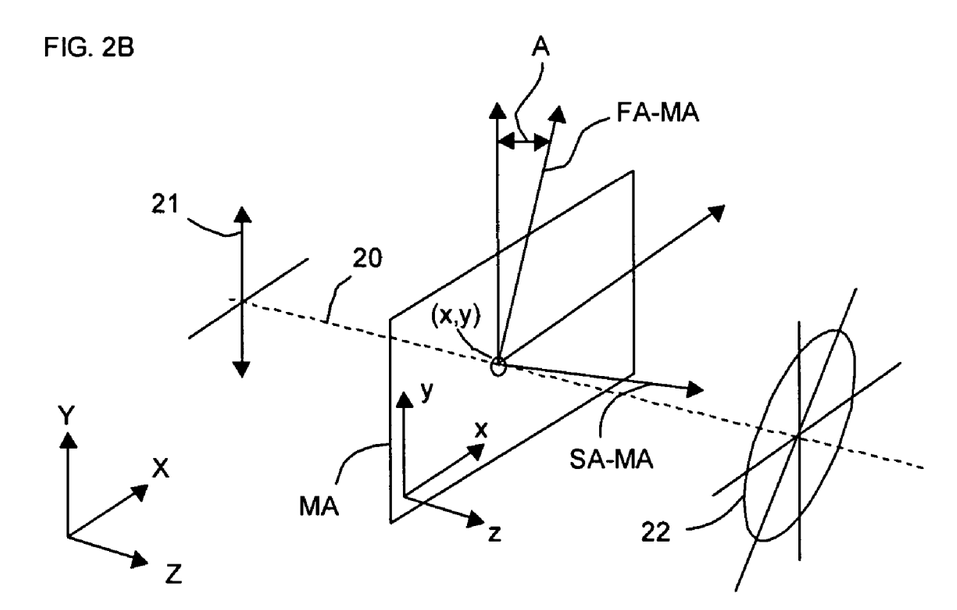
FIG. 2B illustrates impact of a birefringent mask on a state of polarization of radiation traversing the mask.

The effect of the angle A on the state of radiation traversing the reticle in a point (x,y) on the reticle MA is schematically illustrated in FIG. 2B. The input polalarization of an incoming ray 20 of light is a linear polarization state. In FIG. 2B the incoming radiation is linearly polarized parallel to the y-axis, as illustrated by the arrow 21. The fast axis FA-MA at a point (x,y) of intersection with the reticle of the incoming ray subtends an angle A with respect to the y-direction, and the impact of the presence of the reticle on this ray is that it emerges from the reticle with a resultant elliptical polarization, as illustrated by the ellipse 22. The parameters describing the exact shape and orientation of the ellipse 22 depend on the angle A(x,y) and the phase retardation N(x,y) at the point (x,y). The effect of diffraction of radiation at features (not shown in FIG. 2B) of a mask pattern present near the point (x,y) is not changing the effect of birefringence on the state of polarization: resulting diffracted rays all have said elliptical polarization. A pattern with features extending along the y direction leads to diffracted oblique rays in the x-z plane. In the absence of birefringence these oblique rays would be p-polarized. The impact of the reticle is that image formation is now accomplished with elliptically (and hence not fully p-polarized) radiation resulting in a decrease of image contrast.

Data describing A(x,y) and N(x,y) can for example be obtained by measurement of the reticle birefringence, and can be provided to the data storage device DS. In the present embodiment these data are used to first calculate the average values of A and N, to be denoted by Aav and Nav, as obtained by averaging these values over an area of the reticle MA which comprises the mask pattern.

Figure 2C:
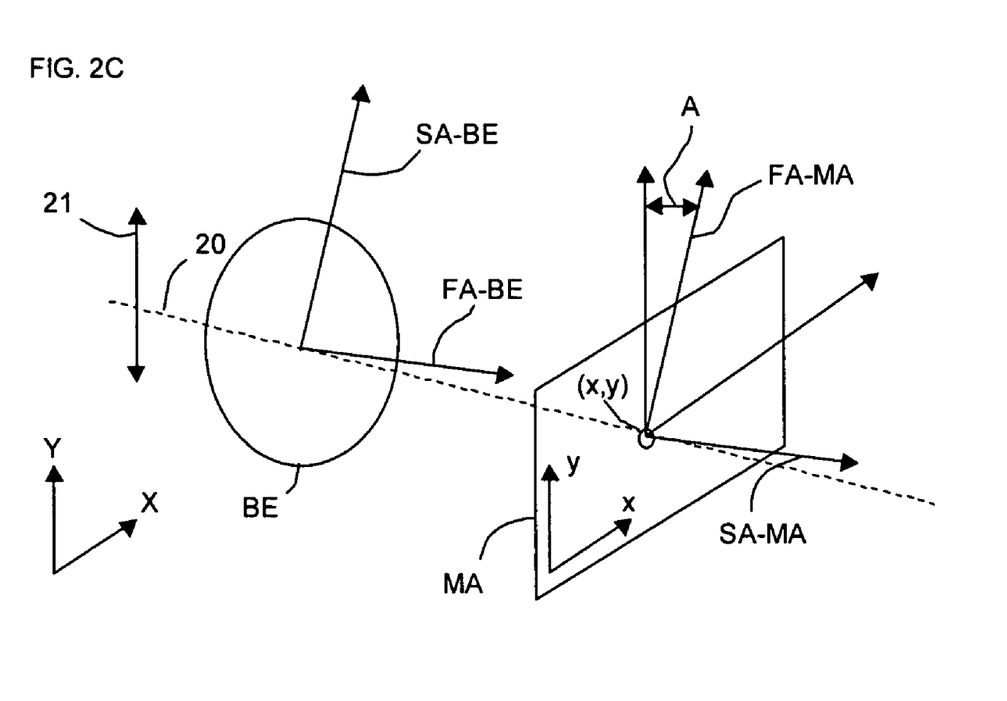
FIG. 2C illustrates compensation of mask birefringence using a separate birefringent element.

An impact of a reticle with an average birefringence characterized by Aav and Nav on the polarization of radiation traversing that reticle can be compensated by disposing in the path of the radiation beam B a retarder plate BE with a retardation chosen equal to Nav, and with its rotational orientation with respect to the z-axis chosen such that the slow axis SA-BE of element BE is parallel to the average direction Aav of the fast axis FA-MA characteristic for the reticle birefringence. This arrangement of element BE and the reticle MA is illustrated in FIG. 2C, and results in the combination of the reticle MA and the retarder plate BE having an average zero (or at least substantially reduced) phase retardation. Hence, the impact of the reticle on the polarization state at wafer level is reduced, and image contrast improved.

Selected reticle birefringence data stored in the data storage device DS representative for A(x,y) and N(x,y) are retrieved by the controller CN. The controller CN is arranged to calculate the average values Aav and Nav, to identify from a plurality of available, preselected crystalline quartz retarders (with a corresponding preselected plurality of phase retardations) a retarder BE which most closely matches the phase retardation Nav and to instruct the manipulator MN to obtain the selected retarder BE and dispose this retarder BE in the path traversed by the radiation beam B. Each retarder BE is calibrated in relation to the direction of its fast axis FA-BE and its slow axis SA-BE. The manipulator MN comprises a motorized rotatable mount for holding a retarder plate BE in a preselected rotational orientation (of its fast and slow axes) and is arranged to rotate the selected retarder BE such that its slow axis SA-BE aligns with the direction Aav of the reticle in response to a signal representative for Aav. The amount of rotation needed for this alignment is determined by the controller CN and can be applied to the retarder BE by the manipulator MN before, during or after disposing the retarder BE in the optical path.

Birefringence data for a plurality of reticles can be stored in the data storage device DS, so that during usage of a particular reticle the corresponding appropriate compensation of birefringence can be provided in a manner as described above.

The location along the optical path where a compensating retarder BE is placed in the optical path is not critical. It is primarily determined by aspects such as the space available in the apparatus for the manipulator MN, and the lateral extent of the required clear aperture of the retarder element BE. The latter parameter is an optical system design parameter, and is different for different locations along the optical axis. The required clear aperture at a location near the reticle for a stepper respectively a step-and-scan apparatus is such that the mask pattern respectively the slit shaped illuminated area is entirely enclosed within said clear aperture.

The smaller the clear aperture at a location along the optical path, the smaller the diameter of the retarder element can be. Since the cost of a crystalline quartz retarder element BE increases with its diameter, there is a preference to locate the retarder BE at a location where the required clear aperture is relatively small. With apparatus employing a rod-type optical integrator, the aperture of the exit face of the integrator rod is a relatively small clear aperture. The embodiment of the invention illustrated in FIG. 1 schematically shows the placement of the retarder BE at this preferred location.

However, it will be appreciated that the retarder position can also be chosen, for example, in a plane conjugate to the reticle or near the reticle itself (either upstream or downstream of the reticle), or in a pupil plane of either the illumination system IL or the projection lens PS.

Instead of having a plurality of preselected retarders available, it is possible to use just one retarder BE if the birefringent properties Aav and Nav of a relevant group of reticles are distributed within a sufficiently small bandwidth.

According to an aspect of the invention, the polarizing element BE may be embodied as a variable phase retardation plate. Examples of variable phase retardation plates are Babinet and Soleil compensators arranged to adjust the phase retardation to a preselected value of phase retardation. The manipulator MN comprises, besides said rotatable mount, a drive for setting the variable retarder plate to a desired phase retardation in accordance with a signal provided by the controller CN representative for the average phase retardation Nav which is to be compensated. With this embodiment, the need for having available a plurality of retarder plates with a corresponding plurality of phase retardations is alleviated. Electro-optic and piezo optic materials can also be used as retardation plate substrate, because their birefringence can be changed by respectively varying an electric field or pressure within the substrate.

Figure 3:
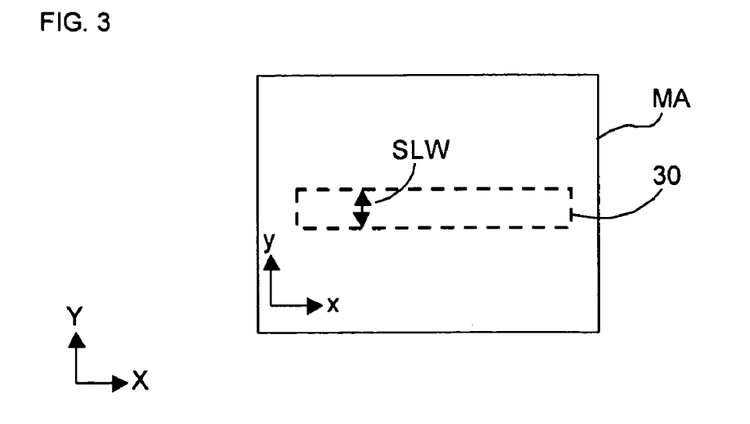
FIG. 3 depicts a slit shaped illuminated area on a mask when used with a scanner.

In an embodiment of the invention the lithographic apparatus is a scanner and the manipulator MN is arranged to adjust a plurality of birefringent elements such as to compensate a field dependent polarization impact of the reticle on the polarization state of the radiation beam at substrate level. In a scanner the illumination system IL is shaping the radiation beam B such that a slit shaped field 30 on the reticle MA is illuminated, see FIG. 3. The slit extends along the X direction, perpendicular to the Y direction corresponding to the scanning direction. Its width is denoted by SLW, as shown in FIG. 3, and is fixed with respect to the X,Y,Z coordinate system.

Figure 4:
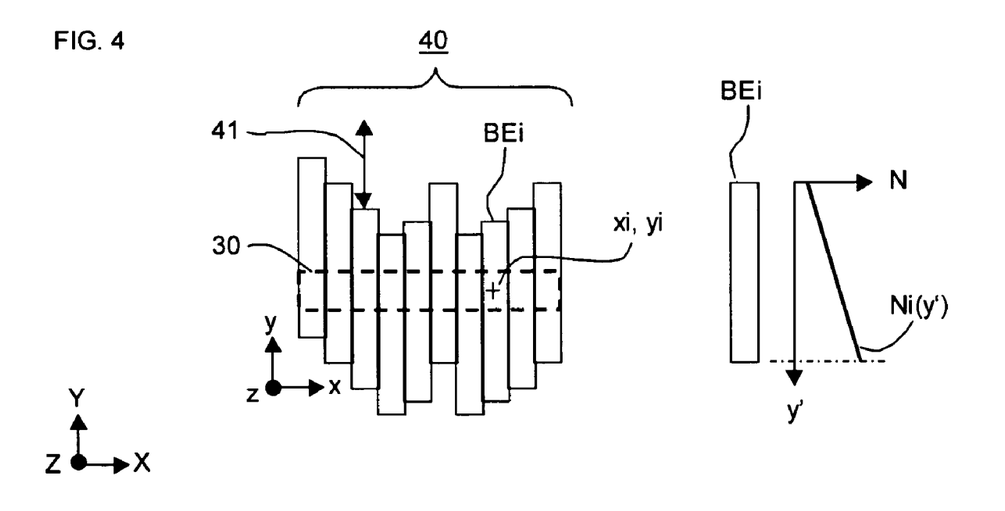
FIG. 4 illustrates an array of birefringent elements for compensation of birefringence of a mask according to an embodiment of the invention, and a plot of phase retardation along an axis of a birefringent element according to an embodiment of the invention.

Any x-dependence of the reticle birefringence RB may cause a field dependent polarization impact of the reticle on the polarization state of the radiation beam at substrate level (in the X-direction). Although similarly an y-dependence of RB causes a field dependent polarization impact in the Y-direction at substrate level, in many instances birefringence variations of the reticle over distances of the order of the width SLW can be ignored or are within tolerance, whereas variations over distances of the order of the length of the slit may be beyond tolerance. As is illustrated in FIG. 4, to compensate for such out of tolerance variations a polarizing element BE is in the present embodiment arranged as an assembly 40 comprising a plurality of birefringent fingers, i.e., a plurality of elongated birefringent elements BEi, (index i running from 1 to the total number of fingers). The birefringent elements BEi have a common direction of elongation, for example along the scanning y-direction, and are disposed parallel to said common direction of elongation. Further, they are mutually displaced with respect to each other in a direction perpendicular to said common direction of elongation. Each birefringent element BEi is arranged movable along its direction of elongation, as illustrated by arrow 41 in FIG. 4, and each birefringent element BEi has a non-uniform distribution of one or more birefringence properties along the axis of elongation.

For example, a birefringent element BEi may have a phase retardation Ni(y') which is linearly varying along the length of a finger. Here y' is a coordinate associated with the finger, along the axis of elongation, see the N-y' plot in FIG. 4. A finger made out of a birefringent crystalline quartz substrate and provided with a wedge shape (such as to obtain a linearly varying thickness along its long dimension) provides such a non-uniform (linearly varying) distribution of phase retardation along its axis of elongation.

The assembly 40 of fingers may be placed near the reticle, and alternatively or in or near a plane optically conjugate to the reticle, so that in a static situation only a part of each finger is irradiated (as illustrated in FIG. 4) and an adjustment 41 can effectively provide a local change of a birefringence property.

For each element BEi data representative for the particular non-uniform distribution of said one or more birefringence properties along the axis of elongation are stored in the storage device DS. For a finger BEi these data may, for example, represent values of Ai(y') and/or Ni(y'). The reticle birefringence data RB can be provided as values RB(A(xi, yi), N(xi, yi)) for a grid of points (xi, yi) on the reticle MA. The coordinates xi can be chosen to coincide with the x-positions of the fingers BEi. During a scan, the slit area 30 will subsequently traverse the array of coordinates yi. Therefore, coordinates yi represent different scan positions of the reticle with respect to the illuminated slit area 30. For each scan position yi the controller CN calculates a plurality of desired positions of the plurality of fingers BEi with respect to the slit area 30 whereby the properties Ai(y') and Ni(y') of the part of the fingers BEi which is irradiated are optimally compensating corresponding local reticle birefringence's RB(A(xi, yi), N(xi, yi)). The manipulator MN adjusts the settings schematically indicated by arrow 41 in FIG. 4 in accordance with the calculated plurality of desired positions for the elements BEi.

According to an aspect of the present embodiment, the slow axes of the fingers may be embodied parallel to each other, and the phase retardation for each finger may be a linear function of y', as described above. The assembly 40 of fingers is arranged in a rotatable mount which is part of the manipulator MN, so that in principle alignment of said slow axes with an average direction Aav of a reticle fast axis FA-MA is possible(within a limited range of directions Aav). Further, by optimally positioning the elements BEi any out of tolerance phase retardation N(x,y) of a reticle can be compensated for the whole field, during scan.

Figure 5:
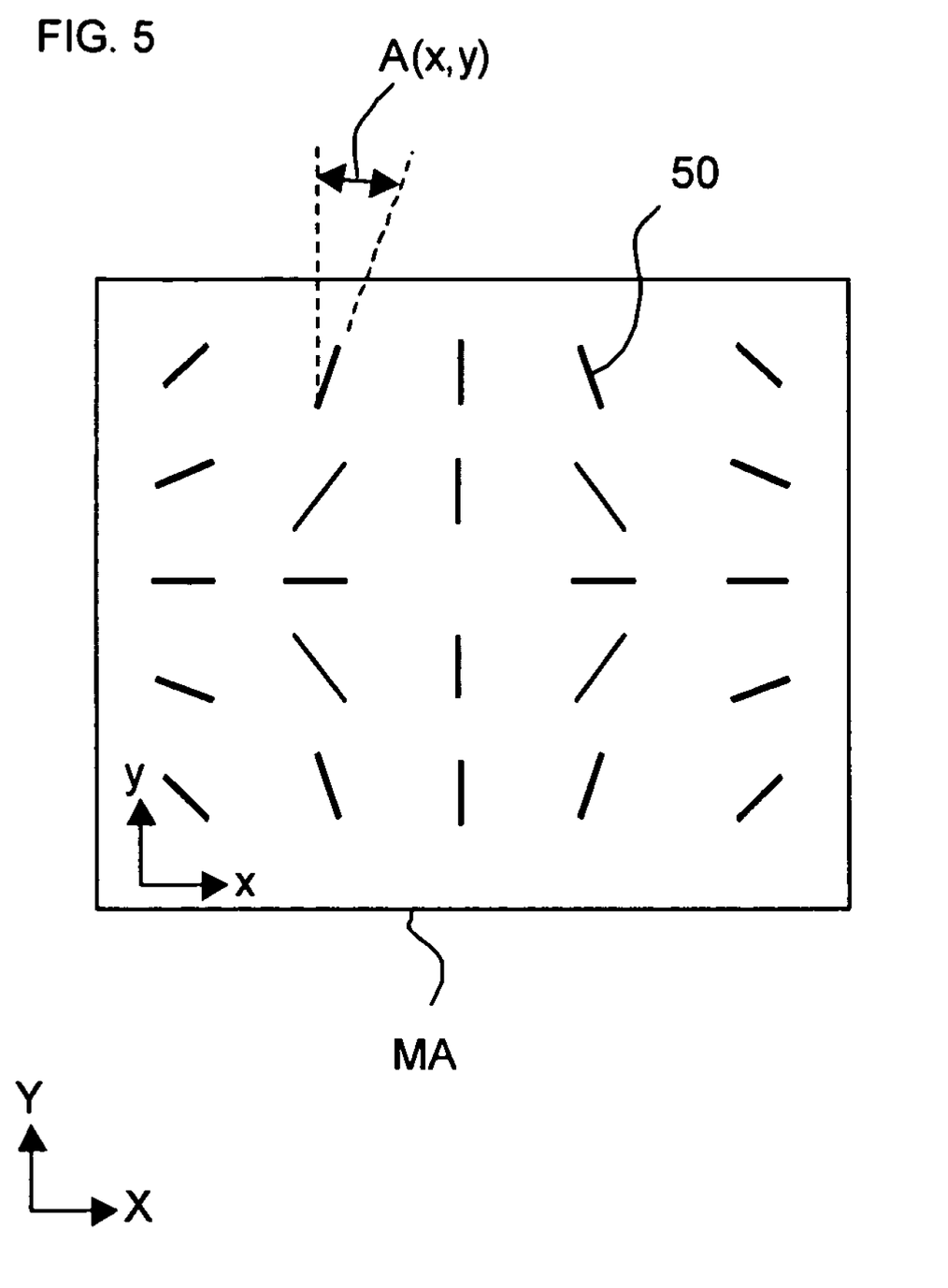
FIG. 5 illustrates a distribution of fast axis directions of a birefringent mask.

A typical reticle birefringence distribution is schematically illustrated in FIG. 5. Contrast loss in an image is primarily caused by an x,y-variation in the orientation of the local fast axis A(x,y), whereas the phase retardation N(x,y) is sufficiently narrowly peaked at an average value Nav to consider it as constant, independent of x,y. Hence, in order to compensate this type of reticle birefringence, modelled as RB(A(x,y), Nav), each finger BEi preferably has a phase retardation Nav, and the direction of the slow axis (Ai(y')+π/2) preferably varies across the finger in accordance with the subsequent values for A(xi, yi) which are affecting the polarization state at wafer level when during scan corresponding subsequent reticle points (xi,yi) are illuminated.

Figure 6:
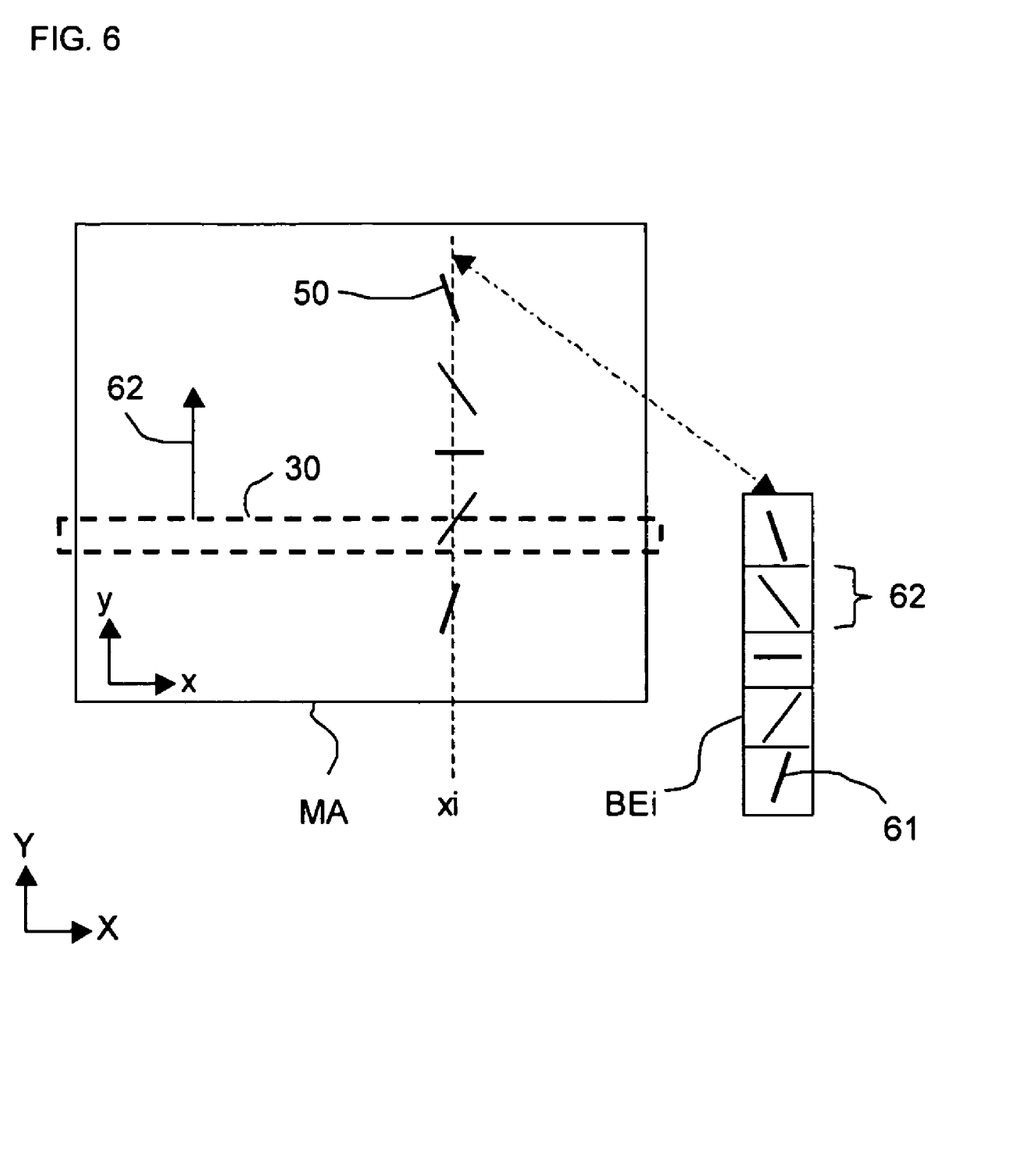
FIG. 6 illustrates a birefringent element for local compensation of fast axis variation of direction along the scanning direction of a mask according to an embodiment of the invention.

As schematically illustrated in FIG. 6, one can identify a number of discrete fast axis directions Ai on a line with xi=constant, which are to be accounted for in the finger BEi. The finger BEi which is to operated and adjusted along the line xi=constant in FIG. 6, may be embodied as an array of birefringent crystalline quartz segments 62, each having a phase retardation Nav, whereby the slow axes of consecutive segments 62 are aligned with corresponding consecutive directions of local fast axes at the reticle along the line xi=constant. In FIG. 6 this is illustrated by the line segments 61 (representing a slow axis direction) being parallel to the line segments 50 (representing local fast axis directions at the reticle).

The birefringent elements BE and also said fingers BEi in any of the above embodiments can be made of birefringent materials transmissive for radiation of the wavelengths mentioned above, such as for example crystalline quartz, $CaF_2$, and $MgF_2$.

Figure 7:
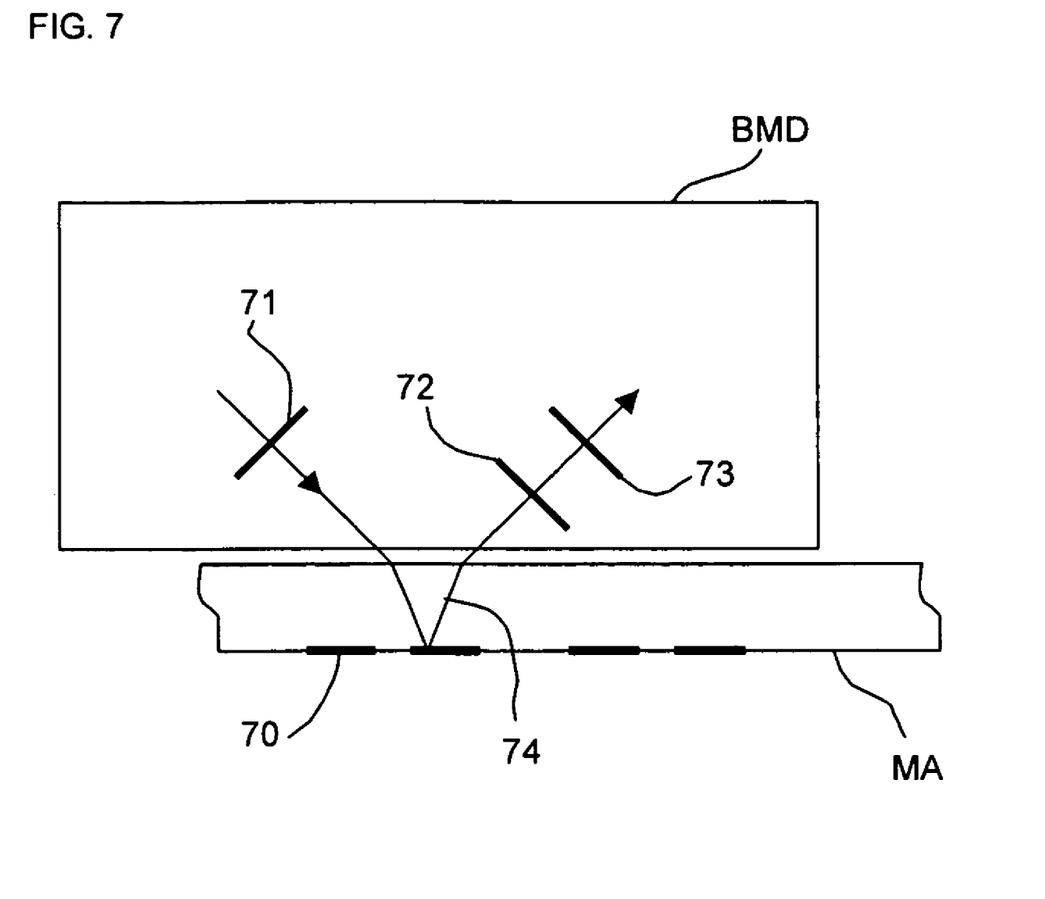
FIG. 7 illustrates a mask birefringence measurement device.

In any of the embodiments described above, the lithographic apparatus may further comprise a birefringence measurement device for measuring the birefringence distribution RB(x,y) of a patterning device such as a reticle. Measurement results can be obtained prior to exposure of the reticle and stored in the device DS. The birefringence measurement device may be part of a reticle handling system or of the reticle stage. FIG. 6 schematically illustrates a birefringence measurement device BMD. The device is of a reflective type; a HeNe laser, not shown in FIG. 7, generates a probe beam 74 which is reflected at chrome features 70 forming the mask pattern on the mask MA and which, upon reflection at the mask surface is captured by a radiation detector (not shown in FIG. 7). A common polarization measurement set-up comprises a linear polarizer, a quarter wave plate, and an analyzer, respectively elements 71, 72 and 73 in FIG. 7. With the HeNe laser generated probe beam 74 the mask substrate is sampled with a polarization measurement set-up whereby the polarizer 71 is in 45 degree with the quarter wave plate. The angle of rotation around an axis coincident with the probe beam of the analyzer gives the information on the reticle birefringence. Other birefringence measurement methods (in transmission or reflection) may be used as well.

According to an aspect of the invention, the birefringence measurement device BMD comprises an alert system which generates a flag to alert a user of the apparatus in case a probed reticle is beyond tolerance in respect of reticle birefringence. Alternatively, a lithographic apparatus can be equipped with said birefringence measurement device BMD comprising an alert system, without further comprising means to provide a compensation of reticle birefringence. The use of reticles beyond tolerance in respect of reticle birefringence can than be avoided.

According to an aspect of the invention, the adjusting to compensate impact of the patterning device on a polarization state of said radiation beam at substrate level is combined with an adjusting to compensate additional impact on the polarization state of the radiation beam at substrate level of deviations from a target radiation-system polarization-characteristic and/or of deviations from a target projection-system polarization-characteristic.

A target radiation-system polarization-characteristic may for example be expressed as a set of preselected Stokes parameters, also referred to as a Stokes vector, describing a desired polarization state of the radiation at mask level. Alternatively, a target radiation-system polarization-characteristic may for example be expressed as a preselected Mueller matrix which in terms of Stokes parameters and Mueller matrix coefficients describes the effect of a system on the state of polarization of the radiation beam traversing that system. For example, if the polarization state of the radiation emanating from the source SO is well defined, this alternative definition of a radiation-system polarization-characteristic may be more suitable for use with the present invention, in which case the desired polarizing properties of the illumination system IL and/or the beam delivery system BD may be described by corresponding Mueller matrices. Similarly, a target projection-system polarization-characteristic of the projection system PS may be described by a corresponding Mueller matrix.

Deviations from a target radiation-system polarization-characteristic and a target projection-system polarization-characteristic may be caused, for example, by the possibility that differences in transmission of radiation energy occur between s-polarized and p-polarized components of radiation upon refraction at curved surfaces of lens elements of the illumination system or the projection system. Since angles of incidence and refraction of a pencil of rays, which images a point at mask level onto a point at substrate level, vary with the coordinates X and Y of the point (X, Y) at mask level (and vary, through the position of the reticle in the X,Y,Z-coordinate system of the apparatus, with the coordinates x and y of the corresponding object point at the reticle), said difference between transmitted s- and p-polarized radiation is generally X,Y-dependent. Similar effects may occur with radiation traversing the radiation system (comprising the source SO, the beam delivery system BD and the illumination system IL shown in FIG. 1. Consequently, the state of polarization at substrate level is generally X,Y-dependent (i.e. characteristic Stokes parameters are functions of X and Y), whereas a target illumination-system polarization-characteristic and a target projection-system polarization-characteristic may be space invariant, for example to ascertain a desired lithographic process uniformity over the area of a die.

Figure 8:
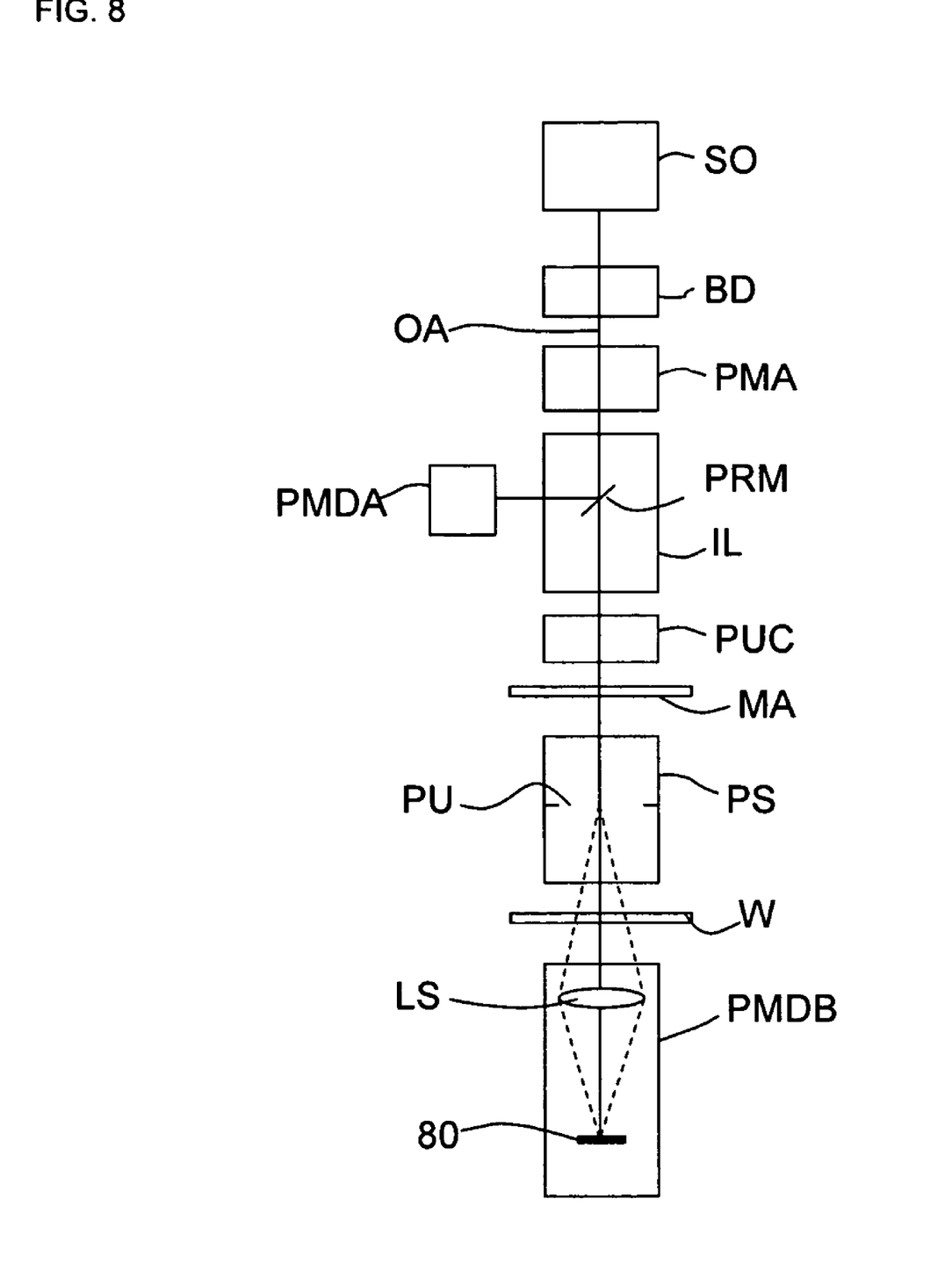
FIG. 8 illustrates relevant entities for polarization control in a lithographic apparatus according to an aspect of the invention.

FIG. 8 illustrates relevant entities for polarization control in a lithographic apparatus according to an aspect of the invention. The system comprising the data storage device DS, the controller CN and the manipulator MN comprising one or more birefringent elements disposed in a path traversed by the radiation beam and arranged for adjusting said one or more birefringent elements to change a polarization state of the radiation beam (see FIG. 1), is referred to hereinafter as the polarization uniformity controller, and schematically indicated by the element PUC in FIG. 8. Analogous to the use for compensating x,y-dependent effects of reticle birefringence RB as expressed by Equation 1, the polarization uniformity controller PUC can be used to compensate X,Y-dependent effects on the state of polarization of the radiation beam at substrate level due to an X,Y-dependency of a radiation-system polarization-characteristic and/or a projection-system polarization-characteristic, as described above.

To control the polarization-characteristic of the radiation system, a polarization manipulator PMA may be disposed in the optical path of the radiation system, see FIG. 8. The control may be needed to correct, for example, for the effects of residual birefringence of optical elements of the beam delivery system BD, whereby said residual birefringence may transform linearly polarized light delivered by an excimer laser SO in FIG. 8 into slightly elliptically polarized light when the laser radiation has traversed the beam delivery system BD. The manipulator PMA may comprise a half wave plate and a quarter wave plate, each rotatable around an axis parallel to the optical axis OA of the radiation system (see FIG. 8), to transform said elliptical polarised light back into linearly polarized light (by adjusting the rotational position of the fast and slow axes of the quarter wave plate with respect to the long and short axes characterizing said elliptical polarization). The manipulator PMA may further be arranged to rotate the polarization axis of linearly polarized light in accordance with a desired direction of linear polarization (by adjusting the rotational position of the fast and slow axes of the half wave plate with respect to the direction of the linearly polarized light impinging on the half wave plate). As a result, linearly polarized light can be provided to the illumination system IL whereby the direction of polarization of the linearly polarized light is preselected in accordance with a preferred illumination mode. For example, if dipole illumination is the selected illumination mode, a preferred orientation of the linear polarization may be the direction perpendicular to a line connecting the two poles, so that s-polarized off axis illumination radiation is provided to the mask MA, thereby improving contrast of images of features in the mask pattern.

However, as explained above, residual polarization errors, i.e. in the present example a deviation from linear polarization, may be present in the illumination radiation impinging on the mask due deviations from a target radiation-system polarization-characteristic as explained above. According to the present invention the polarization uniformity controller PUC provides a compensation of such polarization errors in the same way as compensation of reticle polarization errors due to a presence of reticle birefringence RB as described by Equation 1 is obtained.

In situ polarization measurement devices PMDA and PMDB, see FIG. 8, can be used to obtain data characterizing deviations from a target radiation-system polarization-characteristic and a target projection-system polarization-characteristic. For example, the illumination system IL may comprise a built-in polarization monitor, whereby a partially reflecting mirror PRM with different reflectance's for respectively s-polarization and p-polarization radiation traversing the mirror is disposed in the optical path, to divide a portion of the radiation out from the radiation beam, and to direct that portion to a detector comprised by the measurement device PRMA, for detecting the signal of intensity of said portion of radiation. The signal of intensity can be used to estimate the ratio of s-polarization with respect to p-polarization of the radiation beam. The measurement device PRMA may further comprise a system of polarizing and/or polarization-state changing elements (such as for example a rotatable retarder wave plate and a linearly polarizing analyzer element) and may be arranged to measure components of a Stokes vector using commonly known ellipsometric techniques for analyzing the state of polarization of radiation. The measured Stokes-vector components can be stored as data in the memory device DS and can be compared with a preselected target polarization-characteristic. Differences between measured Stokes vector components and target values for these components are effectively equivalent to data characterizing a birefringence property of a reticle. Hence, in accordance with the present invention, the manipulator MN (comprising one or more birefringent elements disposed in a path traversed by the radiation beam and arranged for adjusting said one or more birefringent elements to change a polarization state of the radiation beam) can be used to compensate additional impact on the polarization state of the radiation beam at substrate level of deviations from the target radiation-system polarization-characteristic, whereby the controller CN responsive to said data is arranged to control said adjusting.

According to an aspect of the invention, data characterizing deviations from a projection-system polarization-characteristic are obtained as well. A supplementary polarization monitor PMDB measuring the state of polarization at substrate level is provided to obtain these data, see FIG. 8. The in situ polarization measurement device PMDB at substrate level may, for example, be embodied as an imaging polarimeter using commonly known ellipsometric techniques for analyzing the state of polarization. Conventional Fourier analysis can be used to calculate Stokes vectors describing the polarization state of radiation. The polarimeter device PMDB may comprise a system of polarizing elements comprising a retarder wave plate capable of being rotated around an axis perpendicular to fast and slow axes of the retarder wave plate (which in an embodiment may correspond to a rotation around an axis parallel to the optical axis OA in FIG. 8), and a fixed analyzer. The retarder and the fixed analyzer are not shown in FIG. 8. In an embodiment of the polarimeter PMBD, the rotational position of the analyzer is selectable by an additional rotation of the system PMDB as a whole around the optical axis OA in FIG. 8. By forming an image of a pupil PU of the projection system PS on a spatially resolving detector 80 (as illustrated by the dashed lines in FIG. 8) such as for example a Charge Coupled Device (CCD) an ellipsometric analysis can be executed for the plurality of detector pixels of the CCD and hence for the corresponding plurality of areas in the pupil which are optically conjugate to the detector pixels. The image formation may be obtained by arranging a lens objective system, element LS in FIG. 8, to project an image of the pupil PU on the detector surface of the CCD. The numerical aperture of the lens objective system LS is preferably larger than the numerical aperture of the projection system PS to alleviate positioning and alignment requirements for the polarimeter PMDB with respect to the projection system PS. The polarization monitor PMDB at substrate level may be embodied as a device fixed to and/or integrated with the substrate support WT in FIG. 1, or alternatively, it may be embodied as a portable device that can be provided to the substrate support WT when a polarization state measurement is desired.

Measurement results obtained with the polarimeter PMDB can be processed and used in a way analogous to the processing and use described above for the data obtained with the polarization measurement device PMDA.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm).

The term "lens," where the context allows, may refer to any one or combination of various types of optical components, including refractive, and reflective optical components.

While specific embodiments of the invention have been described above, it will be appreciated that the invention may be practised otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus arranged to project a pattern from a patterning device onto a substrate using an electromagnetic radiation beam, comprising:
   a data storage device arranged to receive and store data characterizing a birefringence property of the patterning device,
   a manipulator comprising one or more birefringent elements disposed in a path traversed by the radiation beam and arranged to adjust said one or more birefringent elements to change a polarization state of the radiation beam, and
   a controller responsive to said data and arranged to control adjusting by the manipulator to compensate impact of the patterning device on a polarization state of said radiation beam at substrate level.

2. A lithographic apparatus according to claim 1, wherein said birefringence property of the patterning device is a phase retardation.

3. A lithographic apparatus according to claim 2, wherein adjusting by the manipulator comprises varying a phase retardation or selecting a phase retardation of said one or more birefringent elements.

4. A lithographic apparatus according to claim 1, wherein said birefringence property of the patterning device is a direction of a fast axis.

5. A lithographic apparatus according to claim 4, wherein adjusting by the manipulator comprises changing a direction of a fast axis of said one or more birefringent elements.

6. A lithographic apparatus according to claim 1, wherein the apparatus is a step-and-scan apparatus, and wherein the manipulator is arranged to adjust a plurality of elongated birefringent elements, said birefringent elements having a common direction of elongation, and being disposed parallel to said common direction of elongation, and being mutually displaced with respect to each other in a direction perpendicular to said common direction of elongation, each birefringent element being movable along its direction of elongation, and each birefringent element having a non-uniform distribution of one or more birefringence properties along the axis of elongation.

7. A lithographic apparatus according to claim 6, wherein said non-uniform distribution is a distribution of phase retardance.

8. A lithographic apparatus according to claim 6, wherein said non-uniform distribution is a distribution of directions of a slow axis.

9. A lithographic apparatus according to claim 1, further comprising a birefringence measuring device configured to measure birefringence of the patterning device and to provide said data characterizing a birefringence property of the patterning device.

10. A lithographic apparatus according to claim 1, wherein adjusting by the manipulator to compensate impact of the patterning device on a polarization state of said radiation beam at substrate level is combined with an adjusting to compensate additional impact on the polarization state of the radiation beam at substrate level of a deviation from a target radiation-system polarization-characteristic, or a deviation from a target projection-system polarization-characteristic, or both.

11. A lithographic apparatus according to claim 10 further comprising a radiation system configured to provide the radiation beam to the patterning device, a polarization manipulator disposed in the optical path of the radiation system arranged to control a polarization-characteristic of the radiation system, and a polarization measurement device arranged to measure deviation from the target radiation-system polarization-characteristic.

12. A lithographic apparatus according to claim 11 further comprising an illumination system arranged to condition the radiation beam, wherein a partially reflecting mirror with different reflectances for respectively s-polarization and p-polarization radiation traversing the mirror is disposed in the optical path traversed by the radiation beam to direct a portion of the radiation beam to the polarization measurement device.

13. A lithographic apparatus according to claim 11, wherein the polarization manipulator comprises a half wave plate and a quarter wave plate, each rotatable around an axis parallel to the optical axis of the radiation system.

14. A lithographic apparatus according to claim 10 further comprising a projection system configured to project a pattern imparted to the radiation beam by the patterning device onto a target portion of the substrate and a polarization measurement device arranged to measure the deviation from the target projection-system polarization-characteristic.

15. A lithographic apparatus according to claim 14, wherein the polarization measurement device is provided at substrate level and comprises a retarder wave plate capable of being rotated around an axis perpendicular to fast and slow axes of the retarder wave plate, and a linearly polarizing analyzer component.

16. A lithographic apparatus according to claim 15, wherein the polarization measurement device further comprises a spatially resolving detector and a lens objective system arranged to project an image of a pupil of the projection system on the spatially resolving detector.

17. A device manufacturing method comprising projecting a pattern from a patterning device onto a substrate using an electro-magnetic radiation beam, the method comprising:
storing data characterizing a birefringence property of the patterning device,
adjusting one or more birefringent elements to change a polarization state of said radiation beam, and
controlling said adjusting to compensate impact of the patterning device on a polarization state of said radiation beam at substrate level.

18. A device manufacturing method according to claim 17, wherein adjusting to compensate impact of the patterning device on a polarization state of said radiation beam at substrate level further comprises adjusting to compensate additional impact on the polarization state of the radiation beam at substrate level of a deviation from a target radiation-system polarization-characteristic, or a deviation from a target projection-system polarization-characteristic, or both.

19. A device manufacturing method according to claim 18, further comprising controlling a polarization-characteristic of a radiation system providing the radiation beam to the patterning device, using a polarization manipulator disposed in the optical path of the radiation beam and measuring deviation from the target radiation-system polarization-characteristic using a polarization measurement device.

20. A device manufacturing method according to claim 19, further comprising directing a portion of the radiation beam to the polarization measurement device using a partially reflecting mirror with different reflectances for respectively s-polarization and p-polarization radiation traversing the mirror that is disposed in the optical path traversed by the radiation beam.

21. A device manufacturing method according to claim 19, wherein the polarization manipulator comprises a half wave plate and a quarter wave plate, each rotatable around an axis parallel to the optical axis of the radiation system.

22. A device manufacturing method according to claim 18, further comprising measuring deviation from the target projection-system polarization-characteristic using a polarization measurement device.

23. A device manufacturing method according to claim 22, wherein the polarization measurement device is provided at substrate level and comprises a retarder wave plate capable of being rotated around an axis perpendicular to fast and slow axes of the retarder wave plate, and a linearly polarizing analyzer component.

24. A device manufacturing method according to claim 23, wherein the polarization measurement device further comprises a spatially resolving detector and a lens objective system arranged to project an image of a pupil of a projection system, used to project the pattern onto the substrate, on the spatially resolving detector.

* * * * *